(12) United States Patent
van Dal et al.

(10) Patent No.: US 8,614,468 B2
(45) Date of Patent: Dec. 24, 2013

(54) MASK-LESS AND IMPLANT FREE FORMATION OF COMPLEMENTARY TUNNEL FIELD EFFECT TRANSISTORS

(75) Inventors: Mark van Dal, Heverlee (BE); Krishna Kumar Bhuwalka, Asansol (IN)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 258 days.

(21) Appl. No.: 13/162,316

(22) Filed: Jun. 16, 2011

(65) Prior Publication Data

US 2012/0319167 A1    Dec. 20, 2012

(51) Int. Cl.
*H01L 29/70*    (2006.01)
*H01L 29/66*    (2006.01)

(52) U.S. Cl.
USPC .......................................... 257/288; 257/338

(58) Field of Classification Search
USPC .................................. 257/288, 336
See application file for complete search history.

(56) References Cited

U.S. PATENT DOCUMENTS 7,465,976 B2    12/2008  Kavalieros et al.
7,465,978 B2 *  12/2008  Kim et al. ..................... 257/288
7,812,370 B2 *  10/2010  Bhuwalka et al. ............ 257/192

FOREIGN PATENT DOCUMENTS

WO    WO 2010/067214 A1    6/2010

OTHER PUBLICATIONS

Bhuwalka, K.K, "Novel Tunneling Devices for Future CMOS Technologies," Universität der Bundeswehr München, Neubiberg, Jan. 10, 2006, 151 pgs.

* cited by examiner

*Primary Examiner* — Howard Weiss
*Assistant Examiner* — Steven Rao
(74) *Attorney, Agent, or Firm* — Slater & Matsil, L.L.P.

(57) ABSTRACT

A device includes a first source/drain region of a first conductivity type over a silicon substrate, wherein the first source/drain region is at a higher step of a two-step profile. The first source/drain region includes a germanium-containing region. A second source/drain region is of a second conductivity type opposite the first conductivity type, wherein the second source/drain region is at a lower step of the two-step profile. A gate dielectric includes a vertical portion in contact with a side edge the silicon substrate, and a horizontal portion in contact with a top surface of the silicon substrate at the lower step. The horizontal portion is connected to a lower end of the vertical portion. A gate electrode is directly over the horizontal portion, wherein a sidewall of the gate electrode is in contact with the vertical portion of the gate dielectric.

20 Claims, 16 Drawing Sheets

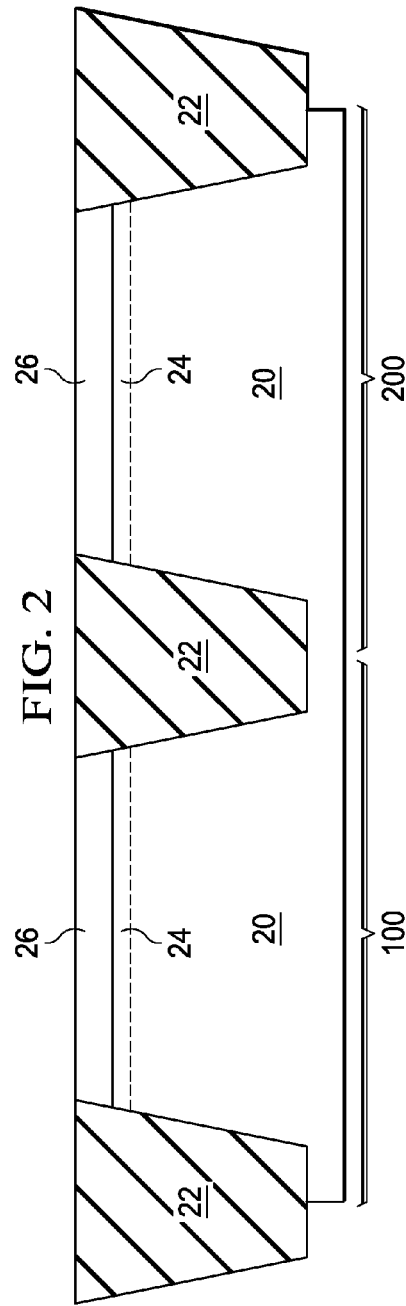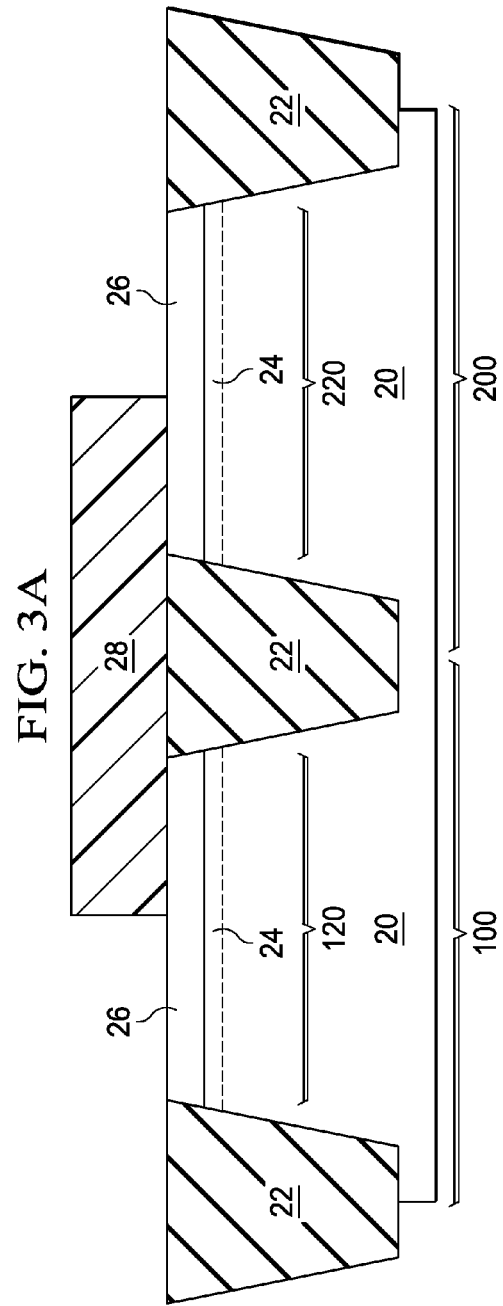

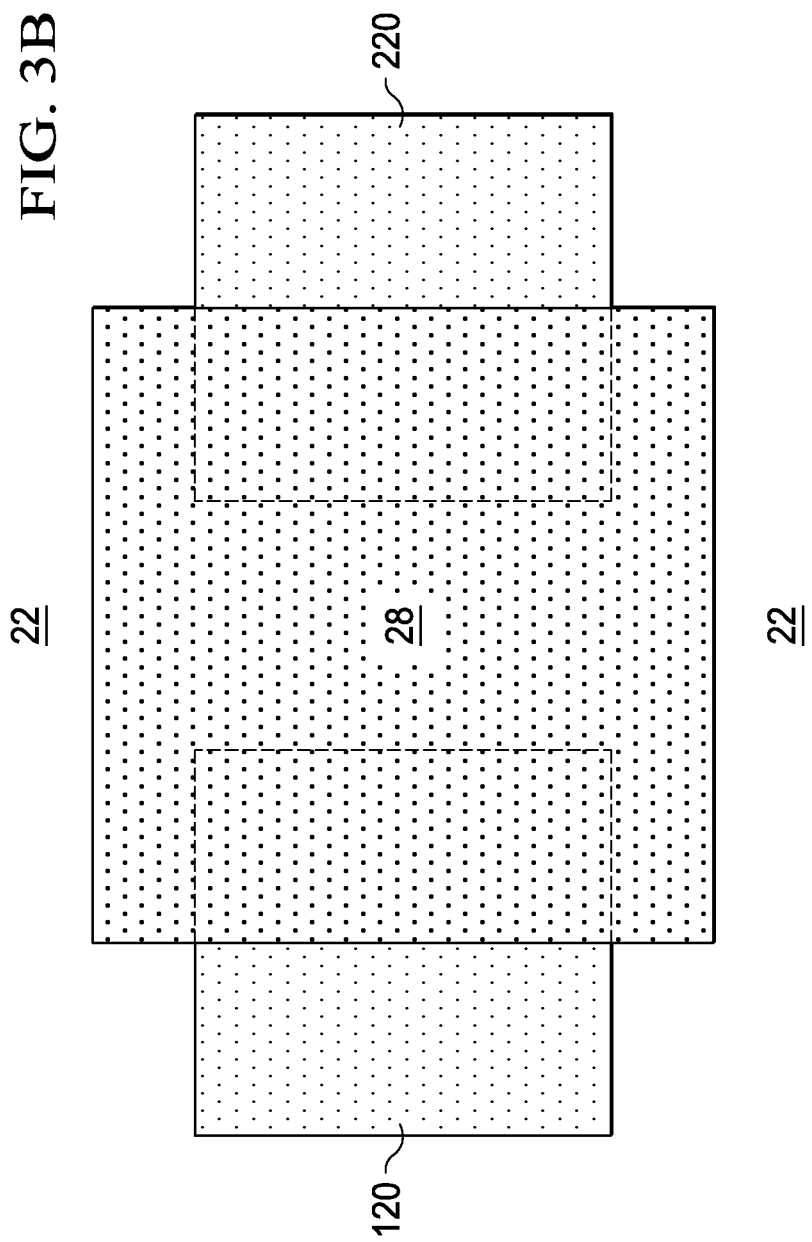

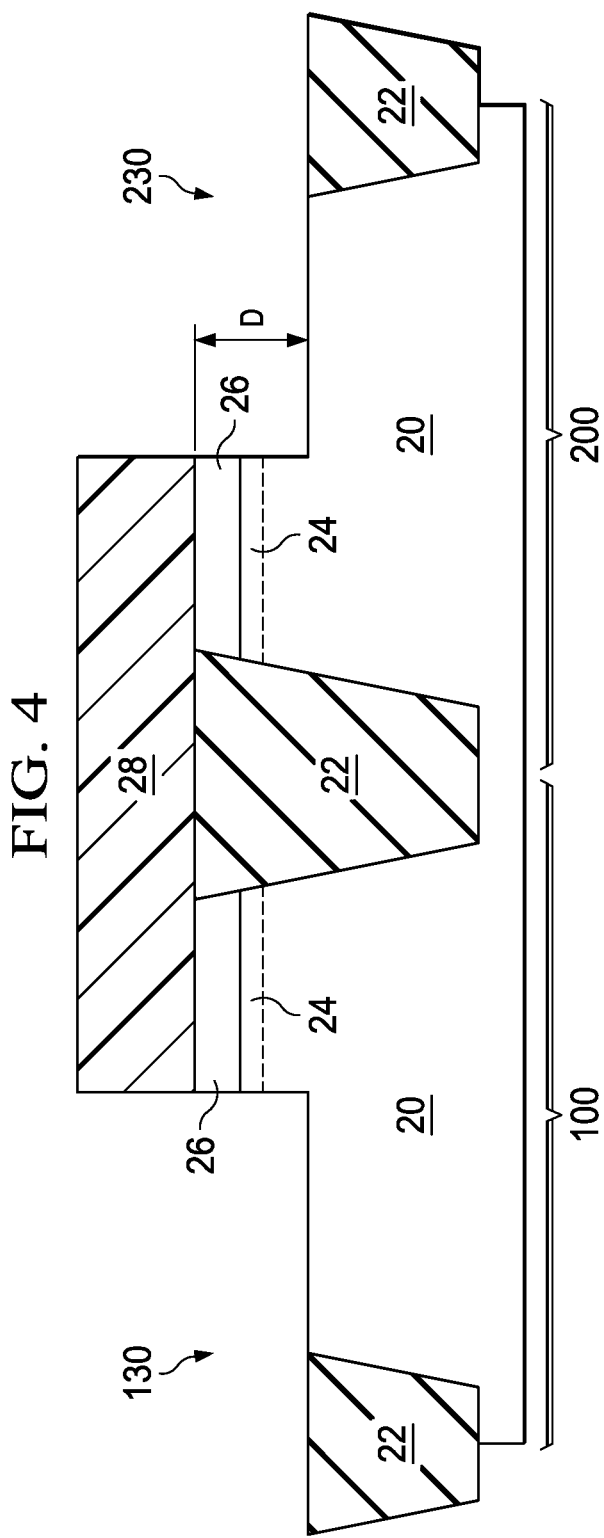

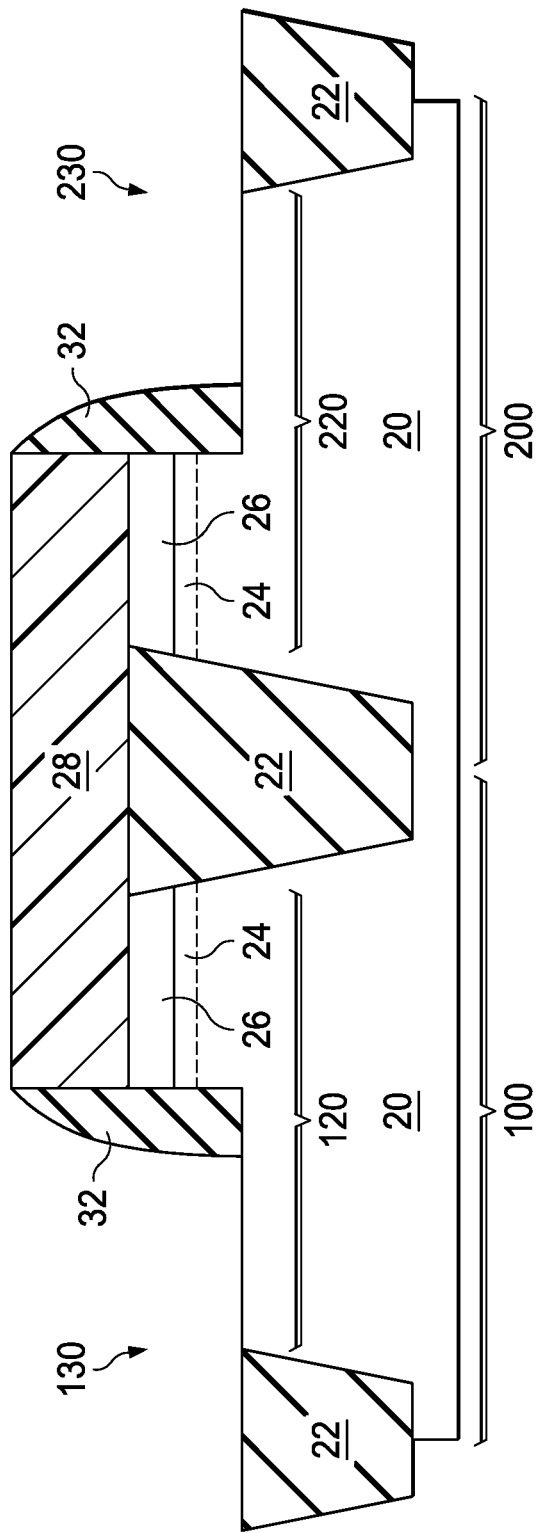

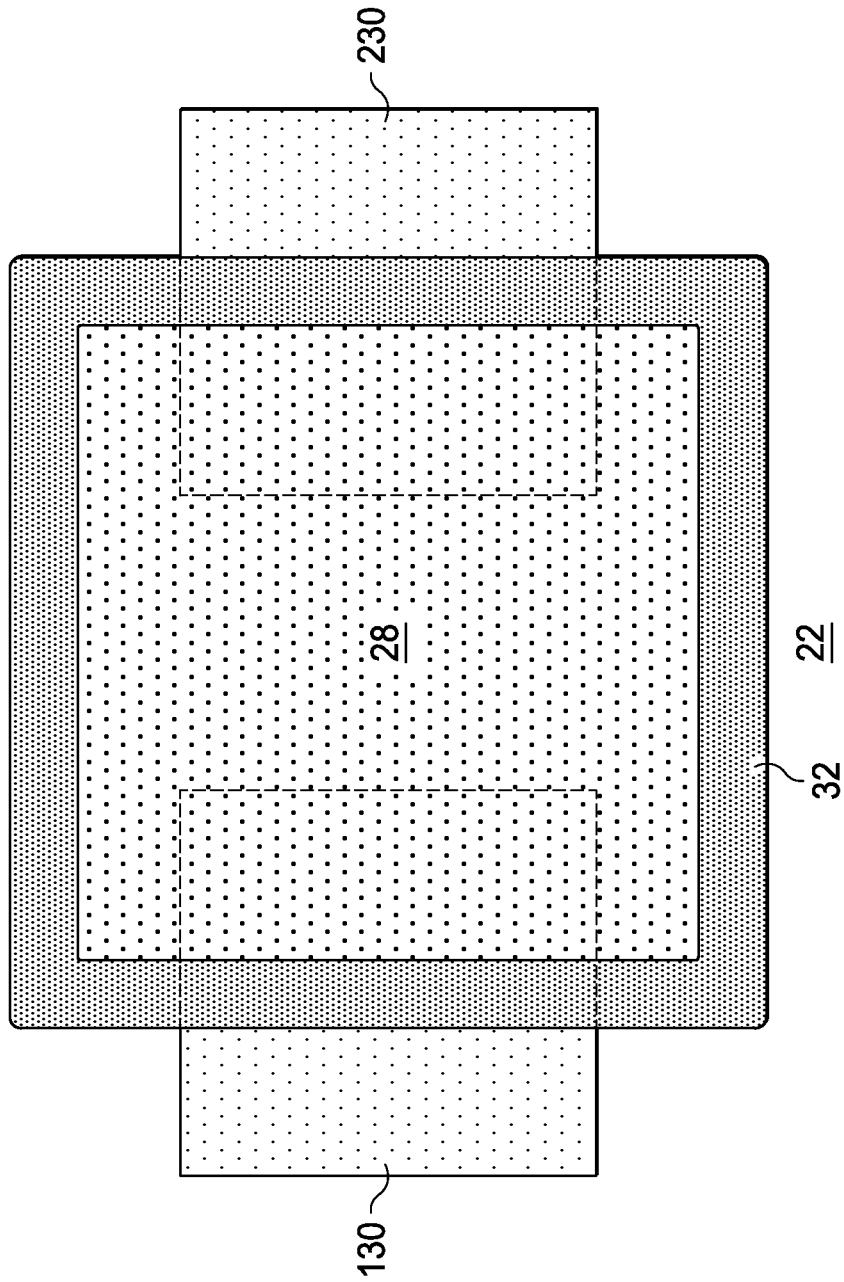

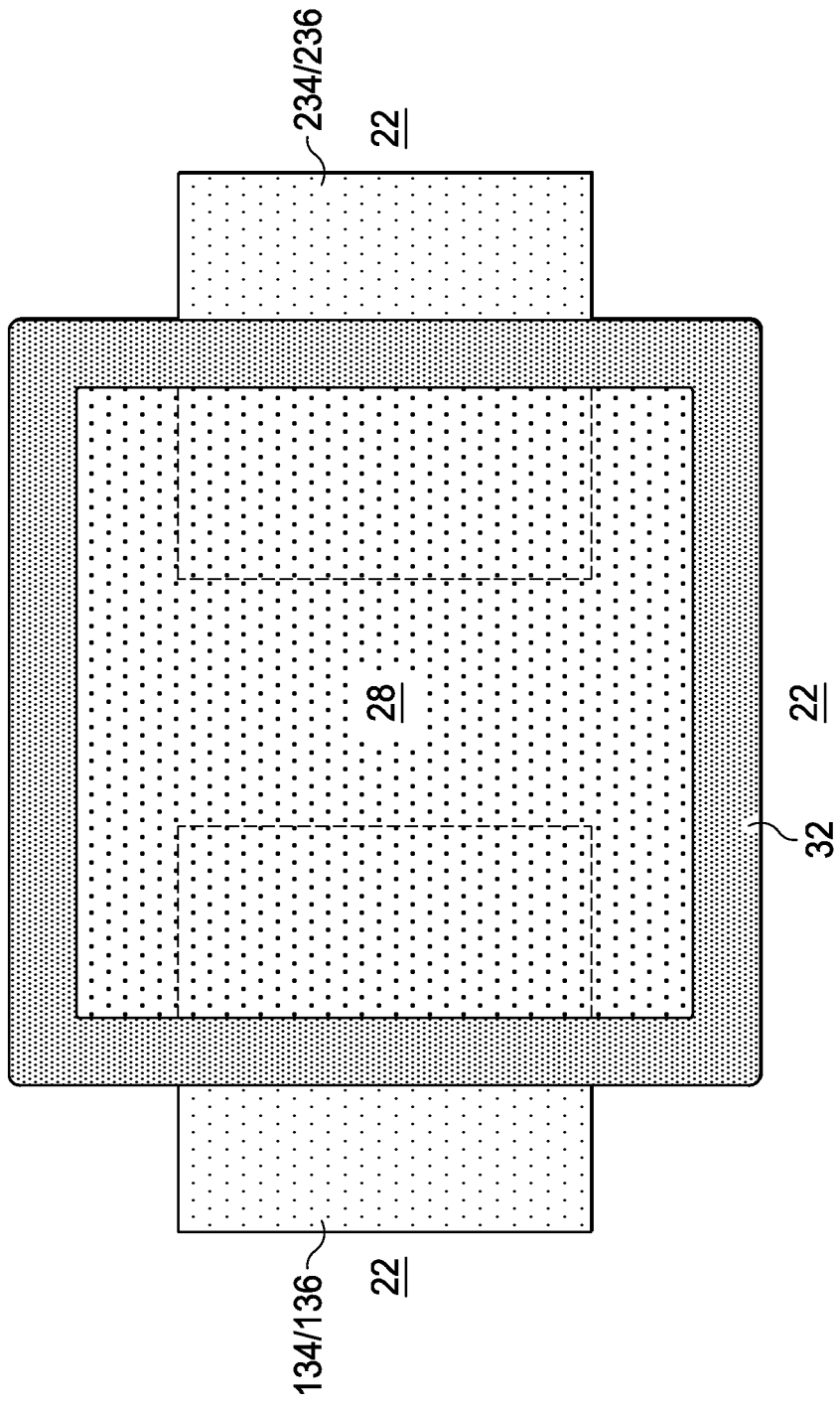

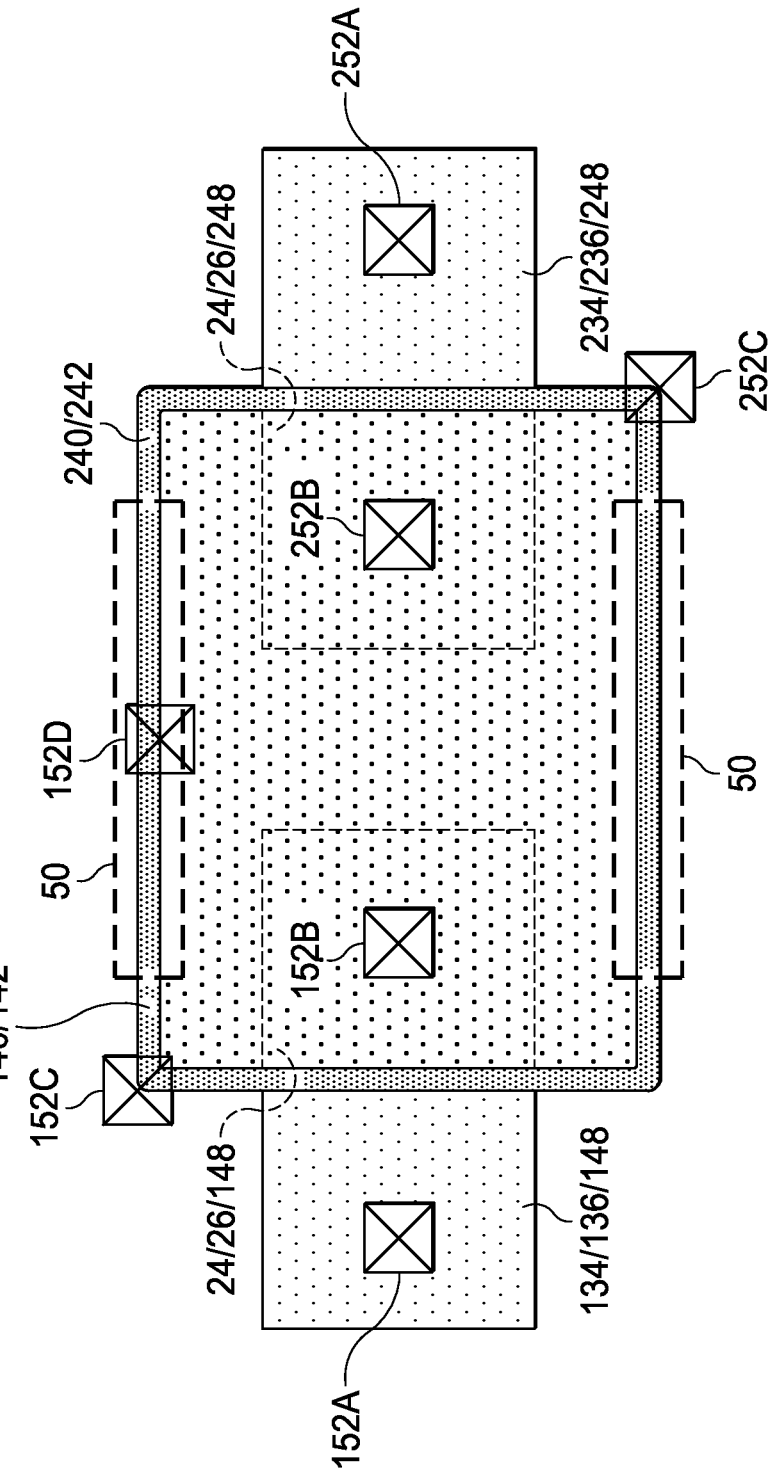

MASK-LESS AND IMPLANT FREE FORMATION OF COMPLEMENTARY TUNNEL FIELD EFFECT TRANSISTORS

BACKGROUND

Metal-oxide-semiconductor (MOS) is a dominating technology for integrated circuits at 90 nm technology and beyond. A MOS device can work in three regions, depending on gate voltage $V_g$ and source-drain voltage $V_{ds}$, linear, saturation, and sub-threshold regions. The sub-threshold region is a region where $V_g$ is smaller than the threshold voltage $V_t$. A parameter known as sub-threshold swing (SS) represents the easiness of switching the transistor current off and thus is an important factor in determining the speed of a MOS device. The sub-threshold swing can be expressed as a function of $m*kT/q$, where m is a parameter related to capacitance. The sub-threshold swing of a typical MOS device has a limit of about 60 mV/decade (kT/q) at room temperature, which in turn sets a limit for further scaling of operation voltage VDD and threshold voltage $V_t$. This limitation is due to the diffusion transport mechanism of carriers. For this reason, existing MOS devices typically cannot switch faster than 60 mV/decade at room temperatures. The 60 mV/decade sub-threshold swing limit also applies to FinFET or ultra thin-body MOSFET on silicon-on-insulator (SOI) devices. However, even with better gate control over the channel, an ultra thin body MOSFET on SOI or FinFET can only achieve close to, but not below, the limit of 60 mV/decade. With such a limit, faster switching at low operation voltages for future nanometer devices cannot be achieved.

To solve the above-discussed problem, tunnel field-effect transistors (FET) have been explored. Tunnel Field Effect Transistors (TFET's) can improve both of these parameters by changing the carrier injection mechanism. In a conventional MOSFET, the SS is limited by the diffusion of carriers over the source-to-channel barrier where the injection current is proportional to kT/q. Hence at room temperature, the SS is 60 mV/dec. In a TFET, injection is governed by the band-to-band tunneling from the valence of the source to the conduction band of the channel. Accordingly, much lower SS can be achieved. Since the tunnel FET is designed on a p-i-n diode configuration, much lower leakage currents are achieved. Also, the device is more resistant to short-channel effects seen in conventional MOSFETs.

In TFETs, the source and drain region are doped asymmetrically. Also, to achieve better TFET performance, sharp junctions are required which is difficult to achieve by implanted junctions. These issues limited most of the TFET fabrication attempts to vertical growth of the source channel and drain. The resulting TFETs suffered from high overlap capacitances between the gates and source/drain regions, and hence the transistor gate delays are increased. Attempts to fabricate horizontal TFET's typically involve complex schemes (since source and drain need to be separately implanted) that limit the scalability of such devices. Another issue arising from heavily doped source/drain regions is ambi-polarity in tunnel FETs due to asymmetrically doped source/drain and device working principle. Therefore there is need for device design to suppress ambi-polarity.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 10B are cross-sectional views and top views of intermediate stages in the manufacturing of a p-type tunnel field-effect transistor (TFET) and an n-type TFET in accordance with various embodiments;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method for forming a p-type tunnel field-effect transistor (TFET, referred to as a PFET hereafter) and an n-type TFET (referred to as an NFET hereinafter) is provided. The intermediate stages of manufacturing embodiments of the present invention are illustrated. Throughout various views and illustrative embodiments of the present invention, like reference numbers are used to designate like elements.

Figure 1A:
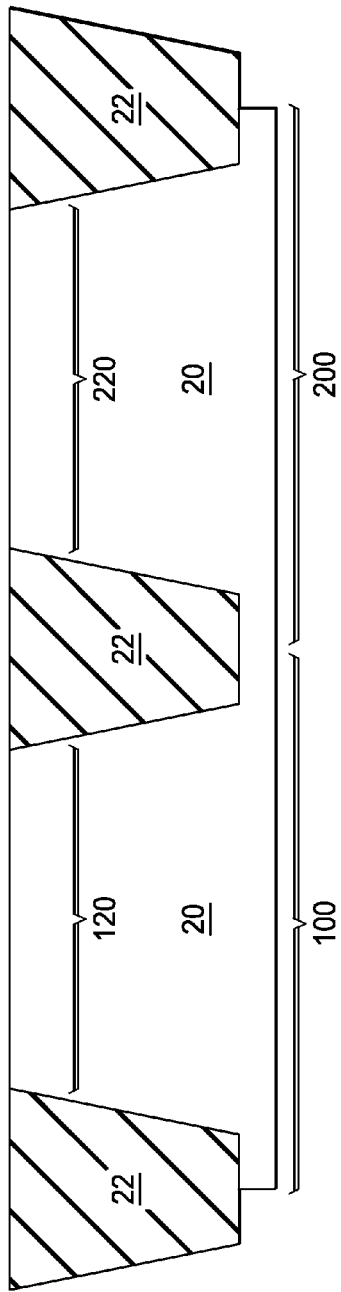
Figure 1B:
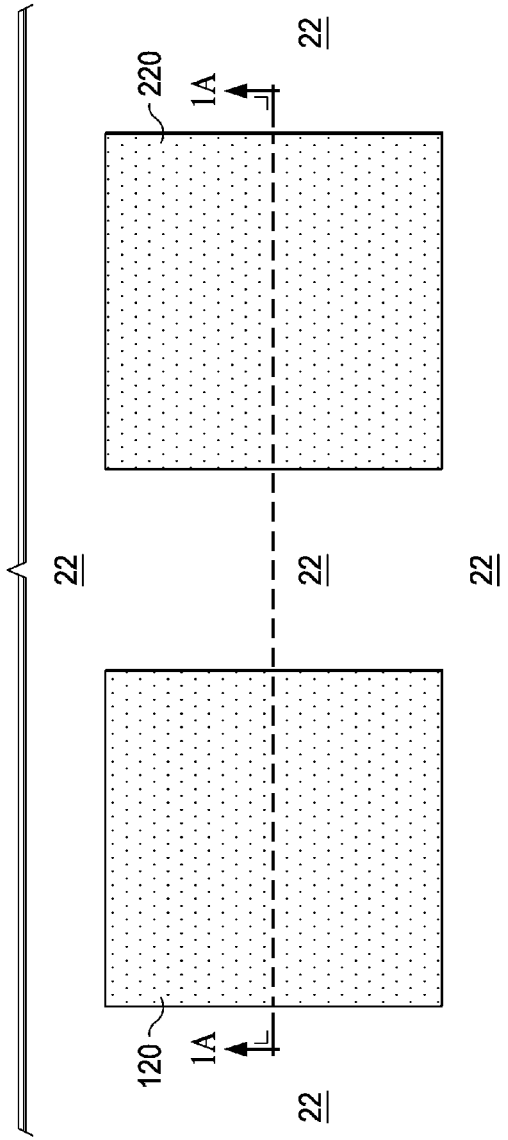

FIGS. 1A through 10B illustrate the cross-sectional views and top views in the formation of a PFET and an NFET. Although the PFET and the NFET are illustrated as formed simultaneously, some or all of the process steps in the formation of the PFET and the process steps in the formation of the NFET may be separated. Referring to FIG. 1A, semiconductor substrate 20 is provided. Semiconductor substrate 20 may be a silicon substrate (which may be free from other semiconductor materials such as germanium). Alternatively, semiconductor substrate 20 may be formed of other known materials. Furthermore, semiconductor substrate 20 may be a bulk substrate, or have a layered structure such as a silicon-on-insulator structure. Substrate 20 may be intrinsic, with the impurity concentration being about $1E15/cm^3$ or lower. Semiconductor substrate 20 includes PFET region 100 and NFET region 200, which may be defined by insulation regions such as shallow trench isolation (STI) region 22. FIG. 1B illustrates a top view of the structure shown in FIG. 1A. STI region 22 define active region 120 in PFET region 100 and active region 220 in NFET region 200.

Referring to FIG. 2, heavily doped semiconductor layer 26 is formed. In the described embodiments, the term "heavily doped" means an impurity concentration of above about $10^{19}/cm^3$, and may be between about $10^{19}/cm^3$ and about $10^{21}/cm^3$. One skilled in the art will recognize, however, that "heavily doped" is a term of art that depends upon the specific device type, technology generation, minimum feature size, and the like. It is intended, therefore, that the term be interpreted in light of the technology being evaluated and not be limited to the described embodiments. Semiconductor layer 26 may be of n-type, and hence is referred to as n+ layer 26 hereinafter. In an embodiment, n+ layer 26 is a silicon layer, which may be substantially free from germanium. N+ layer 26 may be formed by epitaxial growth, and the n-type impurity may be doped in-situ with the proceeding of the epitaxial growth. Accordingly, no implantation is needed in the formation of n+ layer 26. Alternatively, n+ layer 26 may be formed by the implantation of the n-type impurity into substrate 20. Optionally, lightly doped (n−) germanium-containing layer 24 is epitaxially grown before the growth of n+ layer 26, and hence contacts n+ layer 26 and substrate 20. Germanium-containing layer 24 may be a pure germanium layer, a substantially pure germanium layer, or a silicon germanium layer, and hence is referred to as n−Ge/SiGe layer 24 hereinafter. The n-type impurity concentration in n− Ge/SiGe layer 24 may be between about $10^{15}/cm^3$ and about $10^{18}/cm^3$, although greater or smaller concentrations may be used. In an embodiment, n− Ge/SiGe layer 24 is formed in PFET region 100, and not in NFET region 200. Accordingly, the drain region of the resulting PFET includes n− Ge/SiGe layer 24, while the drain region of the resulting NFET do not include n− Ge/SiGe layer 24. In alternative embodiments, as shown in FIG. 2, n− Ge/SiGe layer 24 is formed in both PFET region 100 and NFET region 200, and hence may be epitaxially grown in both PFET region 100 and NFET region 200 without using a mask for the growth.

Referring to FIGS. 3A and 3B, hard mask 28, which may comprise silicon oxide or silicon nitride, is formed and patterned. FIG. 3B is a top view of the structure shown in FIG. 3A. Hard mask 28 covers a portion of each of active regions 120 and 220, and may extend to directly over STI region(s) 22.

FIG. 4 illustrates the formation of recesses 130 and 230 as a result of an etching step. Hard mask 28 is used as the mask for the etching. The portions of active regions 120 and 220, and optionally STI region 22, are recessed. Accordingly, a two-step profile is formed in each of PFET region 100 and NFET region 200. Recessing depth D may be between about 5 nm and about 50 nm, for example. It is realized, however, that the dimensions recited throughout the description are merely examples, and may be changed if different formation technologies are used. The formation of recesses 130 and 230 may include an anisotropic etch.

Next, as shown in FIG. 5A, dummy gates 32 are formed on the sidewalls of hard mask 28, n+ regions 26, and the optional n− Ge/SiGe layers 24. Dummy gates 32 extend into recesses 130 and 230. FIG. 5B illustrates the top view of the structure shown in FIG. 5A. It is observed that dummy gates 32 may form a ring encircling hard mask 28.

Figure 6A:
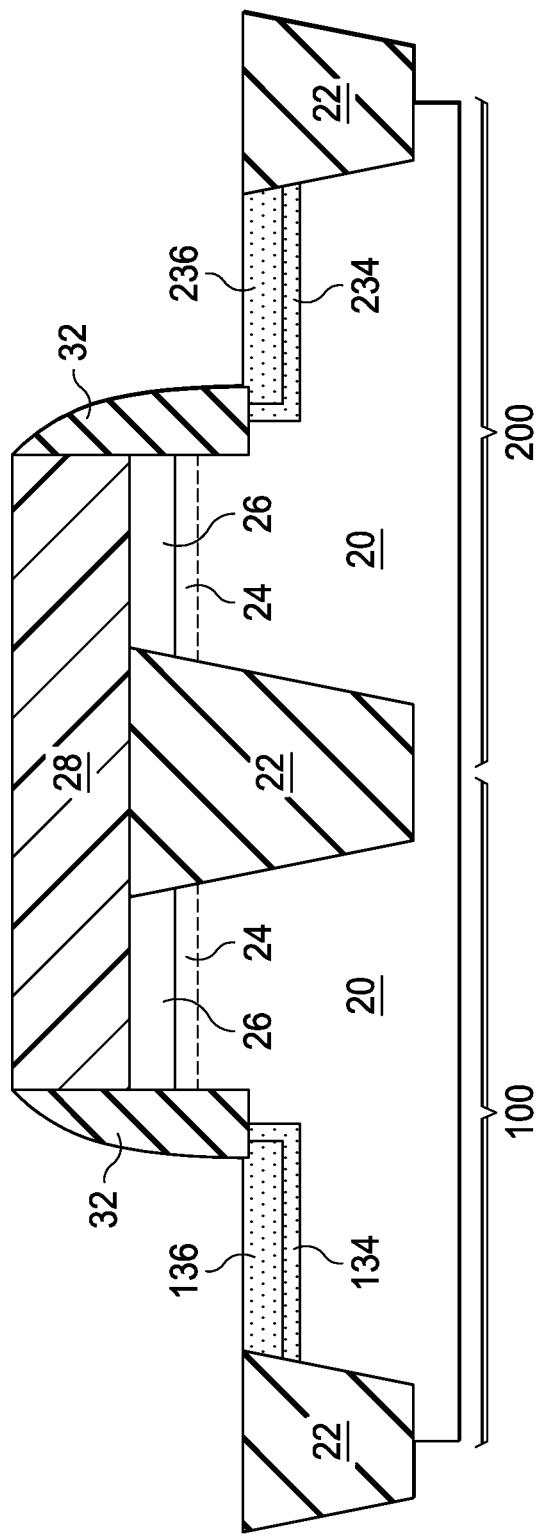

FIGS. 6A and 6B illustrate the formation of heavily doped p-type (p+) Ge/SiGe regions 134 and 234 at the lower step of the two-step profiles, P+Ge/SiGe regions 134 and 234 may be formed of pure germanium, substantially pure germanium, or silicon germanium. Optional p+ silicon regions 136 and 236 (which may be substantially free from germanium) may also be formed over and contacting the respective regions 134 and 234. In an embodiment for forming regions 134/136/234/236, an anisotropic etch is performed to etch the top portions of the lower steps of substrate 20, wherein the respective recesses (occupied by regions 134/234/136/236) may extend to directly under dummy gates 32. P+Ge/SiGe regions 134 and 234 and optional p+ silicon regions 136 and 236 are then formed by epitaxial growth. In alternative embodiments, no recessing is performed before the epitaxial growth of regions 134/234/136/236. In an embodiment, the thickness of silicon germanium regions 134 and 234 is between about 5 nm and about 20 nm, and the thickness of p+ silicon regions 136 and 236 may also be between about 5 nm and about 20 nm.

Figure 7:
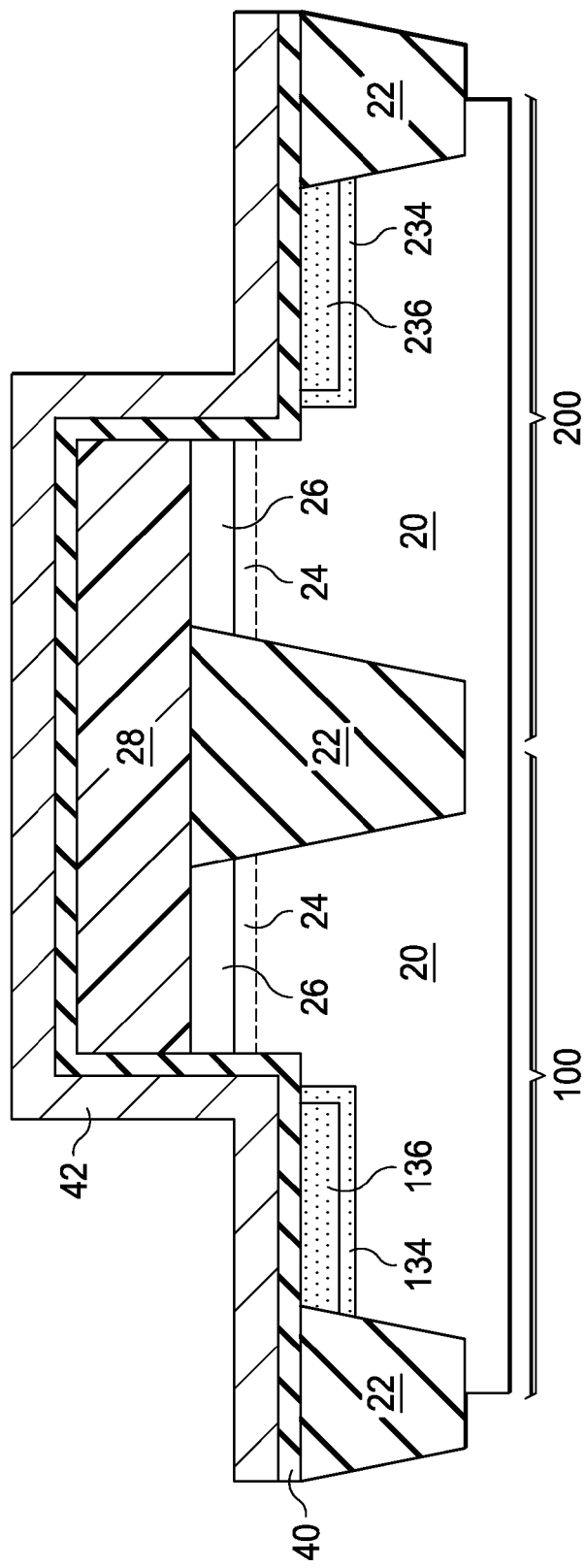
Figure 8:
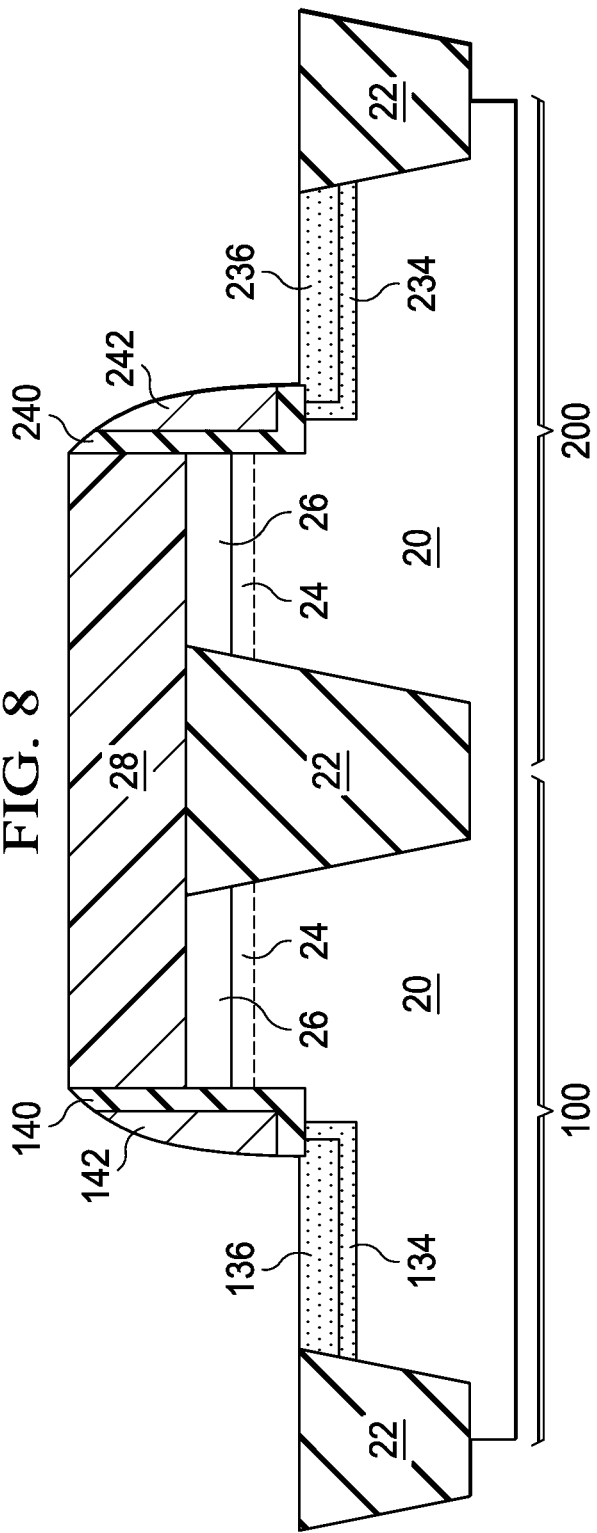

Referring to FIG. 7, dummy gates 32 are removed, for example, by etching. Gate dielectric layer 40 and gate electrode layer 42 are then formed. Gate dielectric layer 40 may be formed of a high-k dielectric material, silicon oxide, silicon nitride, and/or the like. Gate electrode layer 42 may be formed of metals, metal nitrides, metal silicides, and/or the like. As shown in FIG. 8, an anisotropic etching is performed to remove horizontal portions of gate dielectric layer 40 and gate electrode layer 42, and the respective vertical portions are left to form gate dielectrics 140 and 240 and gate electrodes 142 and 242. Each of the resulting gate dielectrics 140 and 240 includes a horizontal portion that is directly under the respective gate electrodes 142 and 242, and a horizontal portion contacting a sidewall of the respective gate electrodes 142 and 242. The horizontal portion of each of dielectrics 140 and 240 has an end connecting to a lower end of the vertical portion of the horizontal portion.

In an embodiment, as shown in FIGS. 7 and 8, gate dielectrics 140 and 240 are formed simultaneously, and have an identical structure. In alternative embodiments, gate dielectrics 140 and 240 may be formed using separate processes, and hence may have different structures. The exemplary formation processes of gate dielectrics 140 and 240 that are different from each other are shown in FIGS. 12 through 20.

Figure 9:
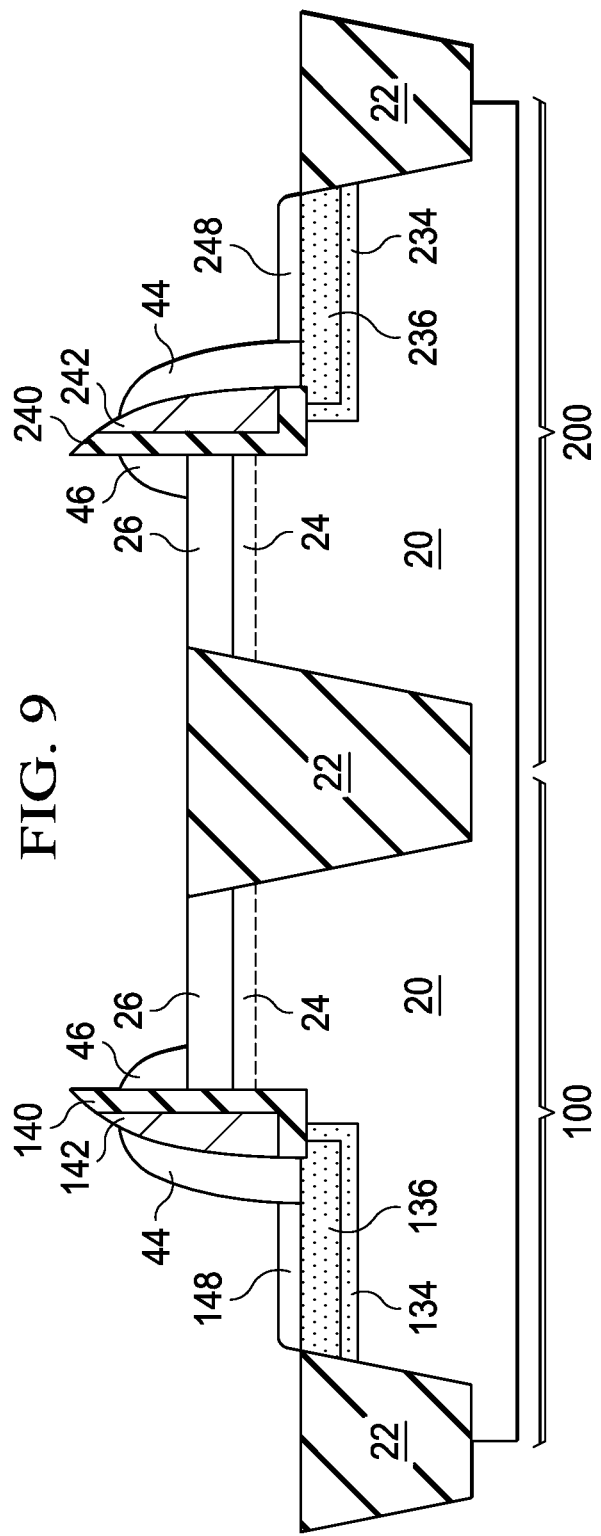

Referring to FIG. 9, after the formation of gate dielectrics 140 and 240 and gate electrodes 142 and 242, spacers 44 and 46 are formed. In an exemplary embodiment, hard mask 28 is removed, so that n+ layer 26 is exposed. Spacers 44 and 46 are then formed. The formation process may also include forming a spacer layer(s), and performing an anisotropic etch. Spacers 44 are formed on the sidewalls of gate electrodes 142. Spacers 46 are formed on the vertical portion of gate dielectrics 140 and 240. The top ends of spacers 44 may be lower than the top ends of gate electrodes 142 and 242, so that contact plugs may be formed to access gate electrodes 142 and 242. Optionally, after the step of forming gate electrodes, and before the formation of spacers 44 and 46, portions of gate electrodes 142 and 242 are removed using a gate cut mask, wherein the portions of gate electrodes 142 and 242 in the dashed regions 50 (FIG. 10B) are removed, while the portions of gate electrodes 142 and 242 outside the dashed regions 50 are left.

Figure 10A:
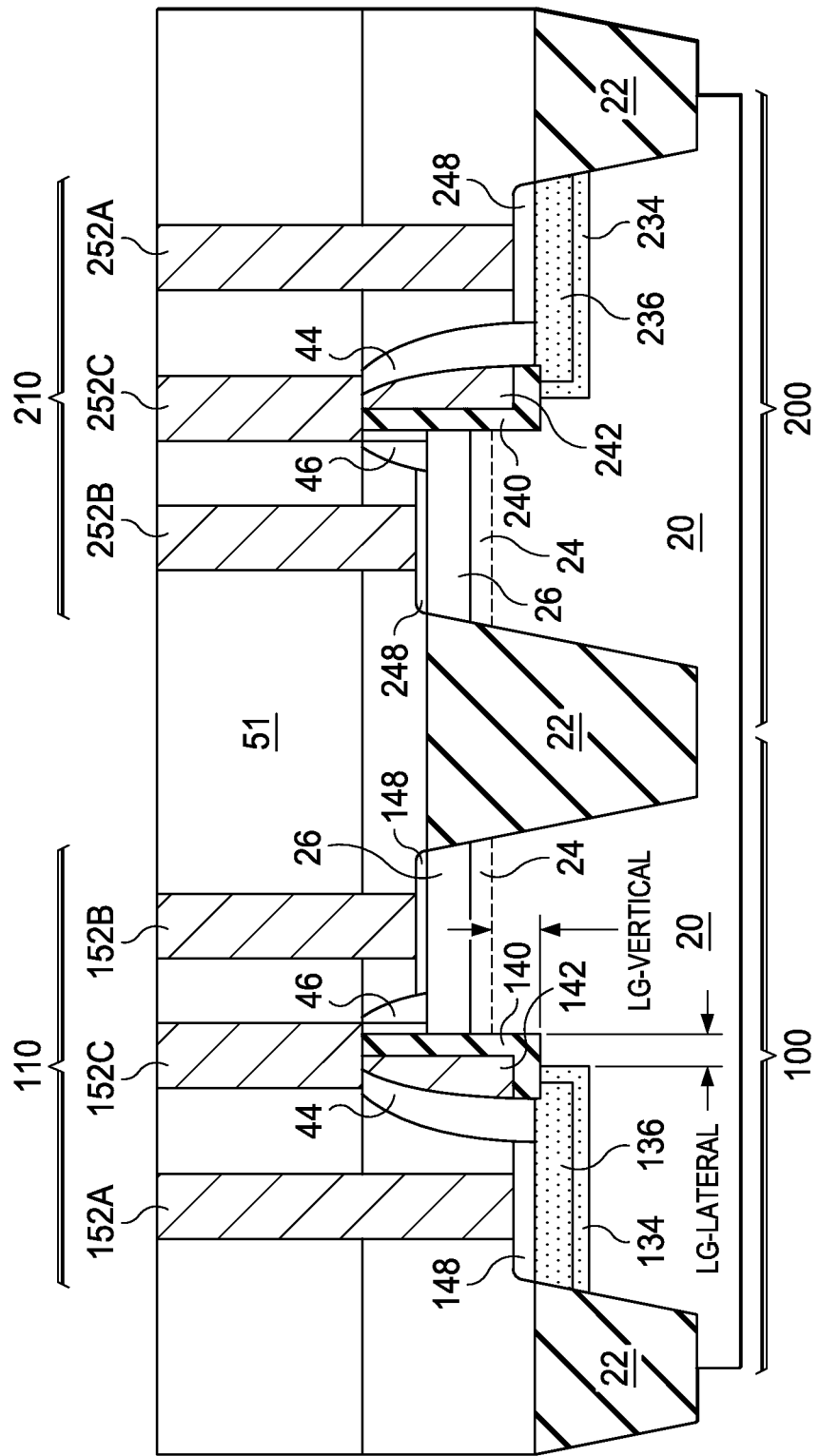

FIGS. 10A and 10B illustrate the formation of the remaining components of PFET 110 and NFET 210, including silicide regions 148 and 248 (using a salicide process, for example), inter-level dielectric 51, and contact plugs 152 (including 152A, 152B, and 152C) and 252 (including 252A, 252B, and 252C). In the resulting structure, regions 134 and 136 (and 234 and 236) may form the source regions, which are at the lower steps of the two-step profiles, and regions 24 and 26 may form the drain regions, which are at the higher steps of the two-step profiles. The source and drain regions are on opposite sides of the vertical portion of the respective gate dielectrics 140 and 240. Bottom surfaces of the drain region 24/26 may be higher than the top surfaces of the horizontal portions of gate dielectrics 140 and 240. An entirety of each of drain regions 24/26 is higher than a portion of substrate 20 that forms the vertical channel of the respective TFET, while at least portions, and possibly entireties of source region 134/136/234/236 may be lower than at least a portion of the vertical channel of the respective TFET.

PFET 110 and NFET 210 may have an identical structure, and whether a FET is a PFET or an NFET depends on how it is used. For example, if a drain voltage is 0V, and the source voltage is a negative voltage, the respective FET is used as a PFET. On the other hand, if a drain voltage is positive voltage, and the source voltage is 0V, the respective FET is used as an NFET. The resulting PFET 110 and NFET 210 may have lateral gate length Lg_lateral between about 5 nm and about 40 nm, or greater than about 40 nm. The vertical gate length Lg_vertical may be between about 5 nm and about 50 nm, for example. In the tunnel FETs in accordance with embodiments, the drive currents of tunnel FETs 110 and 210 are independent from gate length Lg, which is equal to (Lg_lateral+Lg_vertical). Therefore, the increase in gate length Lg will not cause the degradation in drive currents Ion of tunnel FETs 110 and 210. In addition, the short channel effect (SCE) suffered by tunnel FETs 110 and 210 is low.

Figure 11:
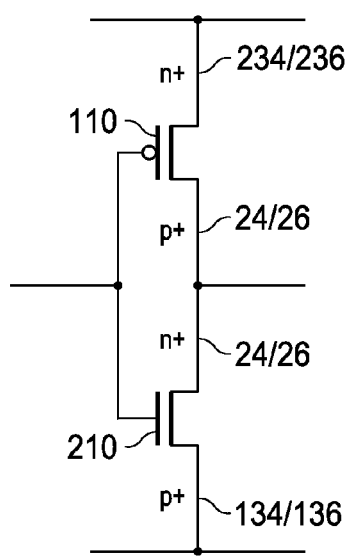
FIG. 11 illustrates a circuit diagram of an inverter formed of the p-type TFET and the n-type TFET.
Figure 12:
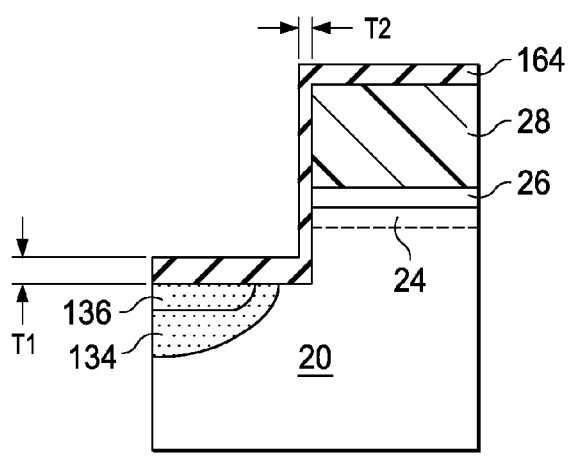
FIGS. 12 through 20 are cross-sectional views of intermediate stages in the formation of the gate dielectrics of the p-type TFET and the n-type TFET.

FIG. 10B illustrates a top view of the structure shown in FIG. 10A, wherein source contact plugs 152A and 252A, drain contact plugs 152B and 252B, and gate contact plugs 152C and 252C are illustrated. In the embodiment wherein no gate cut mask 50 is formed, a common gate contact plug 152D may be formed and shared by PFET 110 and NFET 210. Otherwise, if gate cut mask 50 is formed to remove the portions of gate electrodes 142/242 inside the region marked by dashed lines 50, separate gate contact plugs 152C and 252C are formed. A circuit diagram of an inverter formed of PFET 110 and NFET 210 is shown in FIG. 11.

Figure 13:
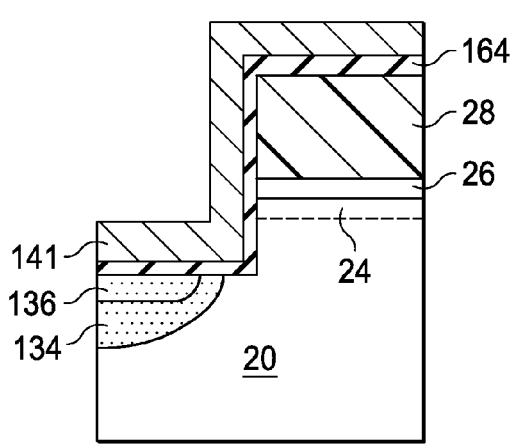
Figure 14:
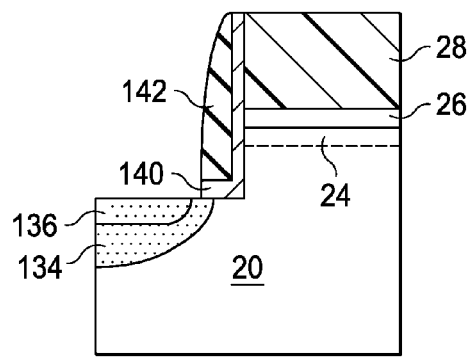
Figure 15:
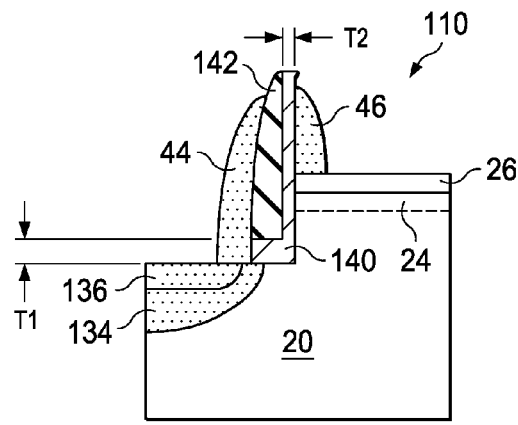

In the embodiment, PFET 110 and NFET 210 may be formed simultaneously, and have an identical structure. The manufacturing cost is thus reduced. FIGS. 12 through 20 illustrate cross-sectional views in the formation of gate dielectrics 140 and 240 having different structures and different thicknesses in accordance with alternative embodiments. FIGS. 12 through 15 illustrate the formation of gate dielectric 140 (also refer to FIG. 8), which is the gate dielectric of PFET 110. The initial steps for forming the structure as in FIG. 12 may be essentially the same as in FIGS. 1A through 6B. Next, dummy gate 32 as shown in FIGS. 6A and 6B is removed, and gate dielectric layer 164 (FIG. 12) is deposited. The formation process may include a non-conformal deposition process, so that thickness T1 of the horizontal portion of gate dielectric layer 164 is greater than thickness T2 of the vertical portion. In an exemplary embodiment, ratio T1/T2 may be greater than about 1.5, or greater than about 3. Next, as shown in FIG. 13, gate electrode layer 141 is formed on gate dielectric layer 264, followed by the removal of the horizontal portions of gate dielectric layer 164 and gate electrode layer 141 to form gate dielectric 140 and gate electrode 142, respectively. The resulting structure is shown in FIG. 14. In a subsequent step, as shown in FIG. 15, spacers 44 and 46 are formed. The subsequent process steps for forming the remaining portions of PFET 110 may be essentially the same as shown in FIGS. 9 through 10B, and hence are discussed herein.

Figure 16:
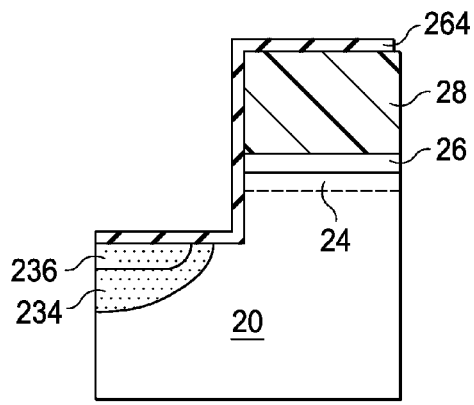
Figure 17:
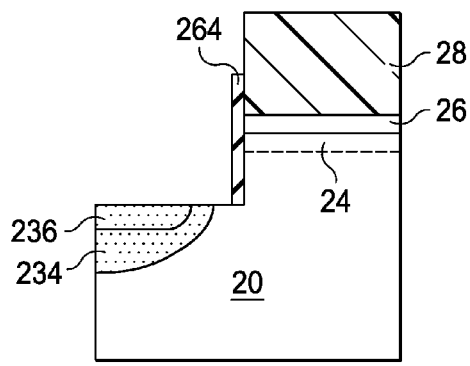

FIGS. 16 through 20 illustrate the formation of gate dielectric 240 (FIG. 8), which is the gate dielectric of NFET 210. The initial steps for forming the structure as in FIG. 16 may be essentially the same as in FIGS. 1A through 6B. Next, as shown in FIG. 16, dummy gate 32 as shown in FIG. 6A is removed, and gate dielectric layer 264 is deposited. Gate dielectric layer 264 may be formed using a conformal deposition process, so that the horizontal portions and the vertical portions have substantially the same thickness, for example, with less than 20 percent, or less than 10 percent, difference. Next, as shown in FIG. 17, an anisotropic etch is performed on gate dielectric layer 264, and the horizontal portions are removed, while a vertical portion is left on the sidewalls of hard mask 28 and regions 24 and 26.

Figure 18:
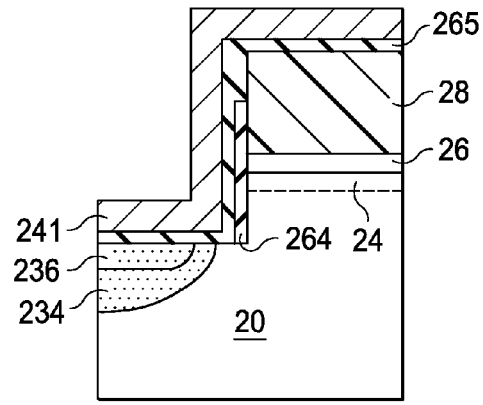
Figure 19:
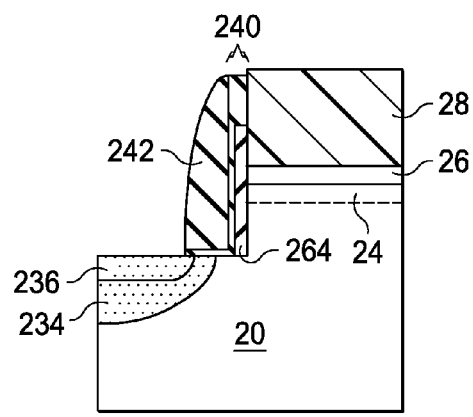
Figure 20:
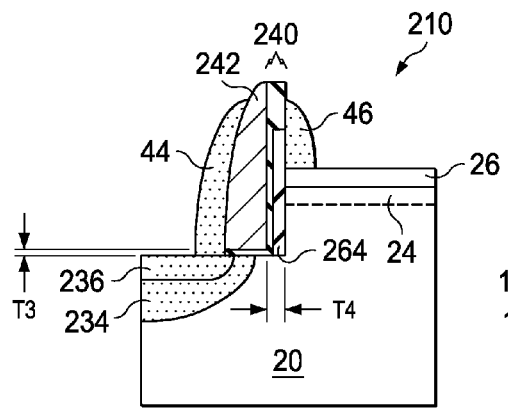

FIG. 18 illustrates the deposition of gate dielectric layer 265 and gate electrode layer 241. Gate dielectric layer 265 and gate electrode layer 241 are then patterned, and the horizontal portions are removed, while the vertical portions are left to form gate dielectric 240 and gate electrode 242, respectively. The resulting structure is shown in FIG. 19. The resulting gate dielectric 240 includes portions from both gate dielectric layers 264 and 265. In a subsequent step, as shown in FIG. 20, spacers 44 and 46 are formed. The subsequent process steps for forming the remaining portions of NFET 210 may be essentially the same as shown in FIGS. 9 through 10B.

Comparing gate dielectric 140 as shown in FIG. 15 and gate dielectric 240 as shown in FIG. 20, it is noted that gate dielectrics 140 and 240 have different planar thicknesses and/or different vertical thicknesses. For example, referring to FIG. 15, for PFET 110, planar thickness T1 of gate dielectric 140 is greater than vertical thickness T2, wherein ratio T1/T2 may be greater than about 1.5, or greater than about 3.0. Conversely, for NFET 210 as shown in FIG. 20, planar thickness T3 of gate dielectric 240 is smaller than vertical thickness T4, wherein ratio T4/T3 may be greater than about 1.5, or greater than about 3. Furthermore, planar thickness T1 of gate dielectric 140 may be greater than planar thickness T3 of gate dielectric 240, with ratio T1/T3 greater than about 1.5, or greater than about 3. Vertical thickness T2 of gate dielectric 140 may be smaller than vertical thickness T4 of gate dielectric 240, with ratio T4/T2 being greater than about 1.5, or greater than about 3.

Simulation results revealed that the PFET and the NFET in accordance with embodiments may have ambi-polarity, and forming gate dielectric 240 having small vertical thickness T3 and gate dielectric 140 having great planar thickness T1 may help suppress the ambi-polarity. Also, great vertical thickness T4 and great planar thickness T1 may also result in the reduction in the gate capacitance for a given effective gate length of the respective PFET and NFET.

Figure 22:
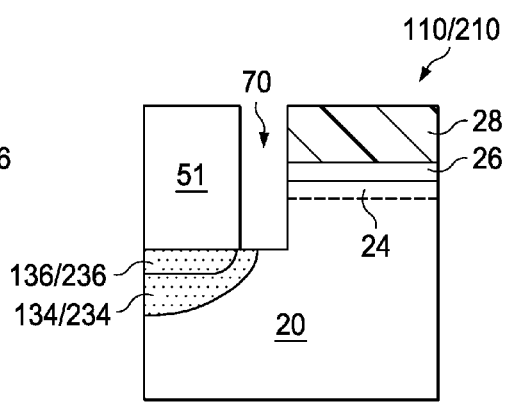
FIG. 21 through 23 illustrate cross-sectional views of intermediate stages in the formation of a gate dielectric and a gate electrode of a TFET using a gate-last approach.
Figure 21:
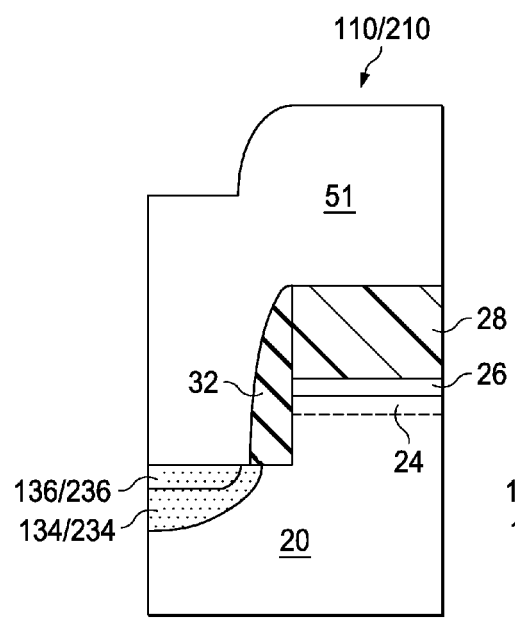
Figure 23:
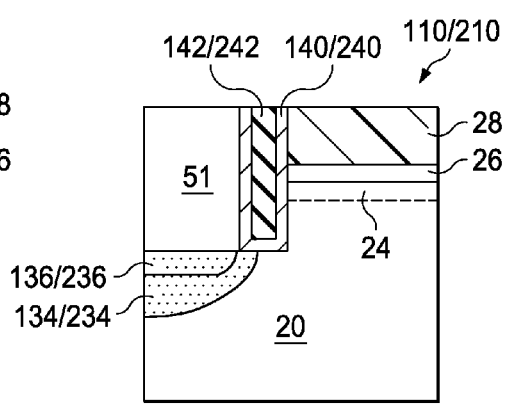

The gates as shown in FIG. 10 are formed using a gate-first approach. Alternatively, the gates of PFET 110 and NFET 210 may also be formed using a gate-last approach. FIGS. 21 through 23 illustrate an exemplary formation process. The FET as shown in FIGS. 21 through 23 may be either PFET 110 or NFET 210, and hence the reference numerals are marked for both. Referring to FIG. 21, after the formation of epitaxy regions 134/136 or 234/236, ILD 51 is formed, and is filled to higher than the top surface of hard mask 28. Next, as shown in FIG. 22, a chemical mechanical polish (CMP) is performed, so that the top surface of ILD 51 is level with the top surface of hard mask 28. An over-polish may be performed to remove a top layer of hard mask 28. Accordingly, the top portions of dummy gates 32 are also polished so that the sidewalls of the remaining portions of dummy gates 32 have substantially vertical sidewalls. Next, dummy gates 32 are etched, leaving opening 70. A gate dielectric layer is then formed using a conformal deposition method, followed by the deposition of a gate electrode layer. The gate dielectric layer and the gate electrode layer are filled into opening 70. As shown in FIG. 23, a CMP is performed to remove excess portions of the gate dielectric layer and the gate electrode layer, and hence gate dielectric 140/240 and gate electrode 142/242 are formed. The resulting gate dielectric 140/240 thus has sidewall portions on opposite sides of gate electrode 142/242 as a result of the gate-last approach.

Although the illustrated embodiments provide a method of forming PFETs and NFET with the p-type regions at lower steps of the two-step profiles, and the n-type regions at the higher steps of the two-step profiles, one skilled in the art will realize that the teaching as provided is readily available for the formation of alternative PFETs and NFETs, with the conductivity types of the respective doped regions inverted.

In the embodiments, the PFET and the NFET may be formed simultaneously, and the formation process may be free from implantations. As a result, the number of masks is reduced, and the manufacturing cost is reduced. To further improve the performance of the PFET and the NFET, the gate dielectrics of the PFET and the NFET may be optimized so that the NFET have a thinner planar gate dielectric and a thicker sidewall gate dielectric, while the PFET have a thicker planar gate dielectric and a thinner sidewall gate dielectric. Furthermore, it is observed that the gate lengths of the PFET and the NFET in accordance with embodiments include vertical portions and horizontal portions. The footprints, however, are the horizontal portions. Therefore, the effective gate length may be increased without increasing the footprints. This may result in better short channel effect (SCE) without compromising the drive current Ion of the respective PFET and the NFET.

In accordance with embodiments, a PFET includes a first gate dielectric having a first vertical portion and a first horizontal portion, wherein an end of the first horizontal portion is connected to a lower end of the first vertical portion. The PFET further includes a first source/drain region on a first side of the first vertical portion, wherein a bottom surface of the first source/drain region is higher than the first horizontal portion; and a second source/drain region on a second side of the first vertical portion opposite the first side of the first vertical portion. A portion of the second source/drain region is lower than the first horizontal portion, and wherein the first and the second source/drain regions are of opposite conductivity types. The PFET further includes a first gate electrode directly over the first vertical portion, wherein a sidewall of the first gate electrode contacts the first vertical portion. An n-type FET includes a second gate dielectric having a second vertical portion and a second horizontal portion, wherein an end of the second horizontal portion is connected to a lower end of the second vertical portion, and wherein at least one of the second vertical portion and the second horizontal portion has a thickness different from a respective one of the second vertical portion and the first horizontal portion. A third source/drain region is on a first side of the second vertical portion, wherein a bottom surface of the third source/drain region is higher than the second horizontal portion. A fourth source/drain region is on a second side of the second vertical portion opposite the first side of the second vertical portion, wherein a portion of the fourth source/drain region is lower than the second horizontal portion, and wherein the third and the fourth source/drain regions are of opposite conductivity types. A second gate electrode is directly over the second vertical portion, wherein a sidewall of the second gate electrode contacts the second vertical portion.

In accordance with other embodiments, a device includes a first source/drain region of a first conductivity type over a silicon substrate, wherein the first source/drain region is at a higher step of a two-step profile. The first source/drain region includes a germanium-containing region. A second source/drain region is of a second conductivity type opposite the first conductivity type, wherein the second source/drain region is at a lower step of the two-step profile. A gate dielectric includes a vertical portion in contact with a side edge the silicon substrate, and a horizontal portion in contact with a top surface of the silicon substrate at the lower step. The horizontal portion is connected to a lower end of the vertical portion. A gate electrode is directly over the horizontal portion, wherein a sidewall of the gate electrode is in contact with the vertical portion of the gate dielectric.

In accordance with yet other embodiments, a method includes epitaxially growing a heavily doped layer on a top surface of a semiconductor substrate, wherein the heavily doped layer is of a first conductivity type. The heavily doped layer and the semiconductor substrate are recessed to form a recess extending into the semiconductor substrate. A gate dielectric is formed to extend into the recess, wherein the gate dielectric comprises a horizontal portion at a bottom of the recess, and a vertical portion contacting a sidewall of a portion of the semiconductor substrate. A portion of the heavily doped layer adjoining the vertical portion forms a first source/drain region of a TFET. A second source/drain region of the TFET is epitaxially grown in a portion of the semiconductor substrate directly under the recess. The second source/drain region is of a second conductivity type opposite the first conductivity type.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A device comprising:
a p-type field-effect transistor (FET) comprising:
 a first gate dielectric comprising a first vertical portion and a first horizontal portion, wherein an end of the first horizontal portion is connected to a lower end of the first vertical portion;
 a first source/drain region on a first side of the first vertical portion, wherein a bottom surface of the first source/drain region is higher than the first horizontal portion;
 a second source/drain region on a second side of the first vertical portion opposite the first side of the first vertical portion, wherein a portion of the second source/drain region is lower than the first horizontal portion, and wherein the first and the second source/drain regions are of opposite conductivity types; and
 a first gate electrode directly over the first vertical portion, wherein a sidewall of the first gate electrode contacts the first vertical portion; and
an n-type FET comprising:
 a second gate dielectric comprising a second vertical portion and a second horizontal portion, wherein an end of the second horizontal portion is connected to a lower end of the second vertical portion, and wherein at least one of the second vertical portion and the second horizontal portion has a thickness different from a respective one of the second vertical portion and the first horizontal portion;
 a third source/drain region on a first side of the second vertical portion, wherein a bottom surface of the third source/drain region is higher than the second horizontal portion;
 a fourth source/drain region on a second side of the second vertical portion opposite the first side of the second vertical portion, wherein a portion of the fourth source/drain region is lower than the second horizontal portion, and wherein the third and the fourth source/drain regions are of opposite conductivity types; and a second gate electrode directly over the second vertical portion, wherein a sidewall of the second gate electrode contacts the second vertical portion.

2. The device of claim 1, wherein the first horizontal portion of the first gate dielectric is thicker than the first vertical portion of the first gate dielectric, and wherein the second horizontal portion of the second gate dielectric is thinner than the second vertical portion of the second gate dielectric.

3. The device of claim 1, wherein the first horizontal portion of the first gate dielectric is thicker than the second horizontal portion of the second gate dielectric, and wherein the first vertical portion of the first gate dielectric is thinner than the second vertical portion of the second gate dielectric.

4. The device of claim 1, wherein the first source/drain region comprises a heavily doped silicon region, and a lightly doped germanium-containing region underlying and contacting a semiconductor substrate and the heavily doped silicon region, and wherein the third source/drain region comprises a heavily doped silicon region over and contacting the semiconductor substrate, with no lightly doped region therebetween.

5. The device of claim 4, wherein the lightly doped germanium-containing region is a silicon germanium region.

6. The device of claim 4, wherein the lightly doped germanium-containing region is a substantially pure germanium region.

7. A device comprising:
a silicon substrate;
a first source/drain region of a first conductivity type over the silicon substrate, wherein the first source/drain region is at a higher step of a two-step profile, and wherein the first source/drain region comprises a germanium-containing region;
a second source/drain region of a second conductivity type opposite the first conductivity type, wherein the second source/drain region is at a lower step of the two-step profile;
a gate dielectric comprising:
    a vertical portion in contact with a side edge the silicon substrate; and
    a horizontal portion in contact with a top surface of the silicon substrate at the lower step, wherein the horizontal portion is connected to a lower end of the vertical portion; and
a gate electrode directly over the horizontal portion, wherein a sidewall of the gate electrode is in contact with the vertical portion of the gate dielectric.

8. The device of claim 7, wherein the second source/drain region comprises a germanium-containing region.

9. The device of claim 8, wherein the second source/drain region further comprises a heavily doped silicon region over and contacting the germanium-containing region of the second source/drain region.

10. The device of claim 7, wherein the germanium-containing region of the first source/drain region is a lightly doped n-type germanium-containing region, and wherein the first source/drain region further comprises a heavily doped silicon region substantially free from germanium over the lightly doped n-type germanium-containing region.

11. The device of claim 7, wherein the gate dielectric is a gate dielectric of a p-type field effect transistor (PFET), and wherein the horizontal portion of the gate dielectric is thicker than the vertical portion.

12. The device of claim 7, wherein the gate dielectric is a gate dielectric of an n-type field effect transistor (NFET), and wherein the vertical portion of the gate dielectric is thicker than the horizontal portion.

13. The device of claim 7, wherein the gate dielectric further comprises an additional vertical portion, wherein the vertical portion and the additional vertical portion are on opposite sides of the gate electrode.

14. A method comprising:
epitaxially growing an heavily doped layer on a top surface of a semiconductor substrate, wherein the heavily doped layer is of a first conductivity type;
recessing the heavily doped layer and the semiconductor substrate to form a recess extending into the semiconductor substrate;
forming a gate dielectric extending into the recess, wherein the gate dielectric comprises a horizontal portion at a bottom of the recess, and a vertical portion contacting a sidewall of a portion of the semiconductor substrate, wherein a portion of the heavily doped layer adjoining the vertical portion forms a first source/drain region of a tunnel field-effect transistor (TFET); and
epitaxially growing a second source/drain region of the TFET in a portion of the semiconductor substrate directly under the recess, wherein the second source/drain region is of a second conductivity type opposite the first conductivity type.

15. The method of claim 14, wherein the step of epitaxially growing the heavily doped layer comprises epitaxially growing an n+ silicon layer.

16. The method of claim 15 further comprising, before the step of epitaxially growing the n+ silicon layer, epitaxially growing a lightly doped n-type germanium-containing layer over the semiconductor substrate, wherein the heavily doped layer is over the lightly doped n-type germanium-containing layer.

17. The method of claim 14, wherein the step of epitaxially growing the second source/drain region comprises:
isotropically forming a an additional recess extending to directly under the horizontal portion of the gate dielectric; and
epitaxially growing a p+ germanium-containing layer in the additional recess.

18. The method of claim 14, wherein the TFET is a p-type FET, and wherein the step of forming the gate dielectric comprises depositing a gate dielectric layer using a non-conformal method, and removing a horizontal portion of the gate dielectric layer to form the gate dielectric.

19. The method of claim 14, wherein the TFET is an n-type FET, and wherein the step of forming the gate dielectric comprises:
forming a first gate dielectric layer;
removing horizontal portions of the first gate dielectric layer, wherein a vertical portion of the first gate dielectric layer is not removed;
forming a second gate dielectric layer, wherein a vertical portion of the second gate dielectric layer contacts the vertical portion of the first gate dielectric layer; and
patterning the second gate dielectric layer to remove a horizontal portion of the second gate dielectric layer, wherein a vertical portion of the second gate dielectric layer and the vertical portion of the first gate dielectric layer form a portion of the gate dielectric.

20. The method of claim 14 further comprising recessing an isolation region in the semiconductor substrate, wherein the step of recessing the heavily doped layer and the semiconductor substrate and the step of recessing the isolation region are performed simultaneously.

* * * * *

UNITED STATES PATENT AND TRADEMARK OFFICE
CERTIFICATE OF CORRECTION

| | | |
|---|---|---|
| PATENT NO. | : 8,614,468 B2 | Page 1 of 1 |
| APPLICATION NO. | : 13/162316 | |
| DATED | : December 24, 2013 | |
| INVENTOR(S) | : Mark van Dal | |

It is certified that error appears in the above-identified patent and that said Letters Patent is hereby corrected as shown below:

In the Claims

In Col. 10, line 40, claim 17, after "forming" delete "a".

Signed and Sealed this
Eighteenth Day of February, 2014

Michelle K. Lee
*Deputy Director of the United States Patent and Trademark Office*